(12) United States Patent
Petcavich et al.

(10) Patent No.: US 11,449,159 B2
(45) Date of Patent: Sep. 20, 2022

(54) METHOD OF MANUFACTURING A TOUCH SENSOR WITH A LOW VISIBILITY CONDUCTIVE MICRO-MESH

(71) Applicant: FUTURETECH CAPITAL, INC., Palo Alto, CA (US)

(72) Inventors: Robert Petcavich, The Woodlands, TX (US); Michael Morrione, Jackson, CA (US); Robert Routh, Latham, NY (US)

(73) Assignee: FUTURETECH CAPITAL, INC., Palo Alto, CA (US)

( * ) Notice: Subject to any disclaimer, the term of this patent is extended or adjusted under 35 U.S.C. 154(b) by 0 days.

(21) Appl. No.: 16/834,520

(22) Filed: Mar. 30, 2020

(65) Prior Publication Data

US 2021/0141470 A1    May 13, 2021

Related U.S. Application Data

(60) Provisional application No. 62/933,576, filed on Nov. 11, 2019.

(51) Int. Cl.
*G03F 7/26* (2006.01)
*G06F 3/041* (2006.01)
*G03F 7/20* (2006.01)

(52) U.S. Cl.
CPC ............... *G06F 3/041* (2013.01); *G03F 7/26* (2013.01); *G03F 7/70* (2013.01); *G06F 2203/04103* (2013.01)

(58) Field of Classification Search
CPC ........................................................ G03F 7/26
See application file for complete search history.

(56) References Cited

U.S. PATENT DOCUMENTS

| 2016/0108269 A1* | 4/2016 | Kosydar | C09D 11/104 |
| | | | 252/503 |
| 2016/0219736 A1* | 7/2016 | Bermel | G06F 1/16 |
| 2016/0291478 A1* | 10/2016 | Petcavich | G03F 7/162 |

* cited by examiner

*Primary Examiner* — Austin Murata
(74) *Attorney, Agent, or Firm* — Womble Bond Dickinson (US) LLP; Joseph Bach, Esq.

(57) ABSTRACT

Light reflection from a metal mesh touch sensor is reduced or prevented by encasing the metal lines with a passivation coating and including non-reflective nanoparticles in the patterning photoresist. The photoresist is mixed with catalytic nanoparticles wherein the nanoparticles are formed to minimize light reflection. The nanoparticles may be carbon coated metallic particles, or uncoated palladium nanoparticles. Also, a standoff photoresist layer may be included between the substrate and the photoresist composition to prevent reflection from the edges of the metallic lines.

22 Claims, 3 Drawing Sheets

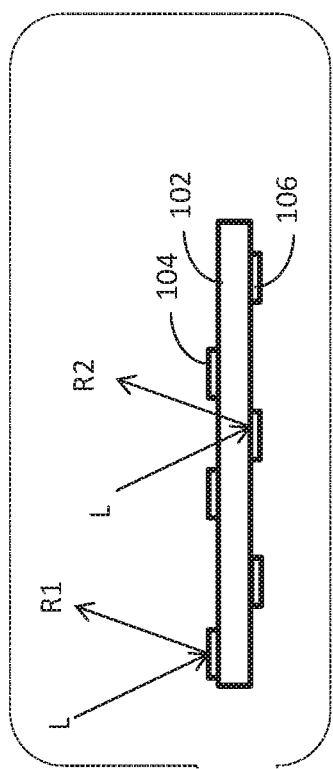
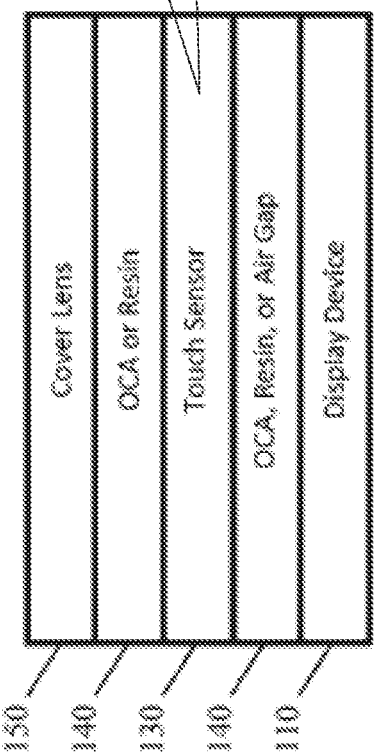
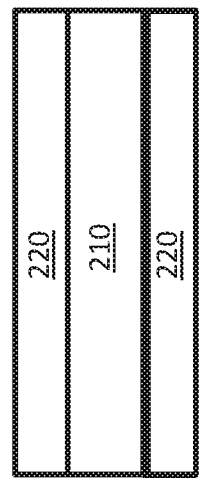
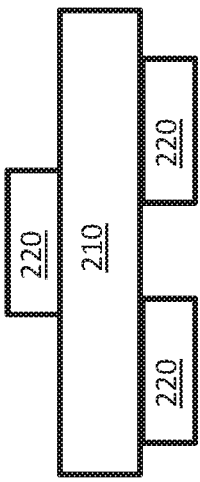
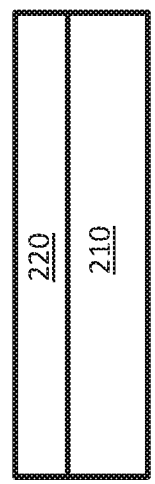
Figure 1
Figure 2A
Figure 2B
Figure 3A
Figure 3B

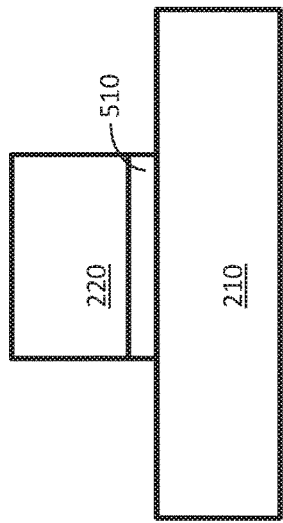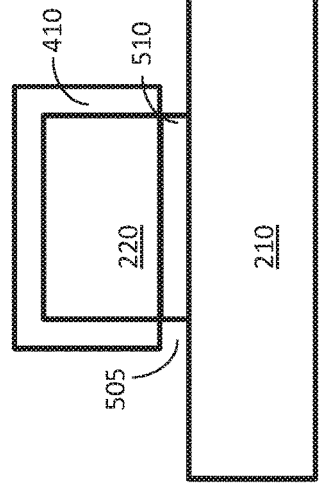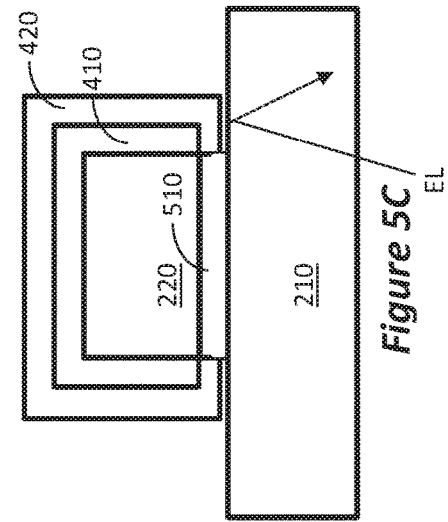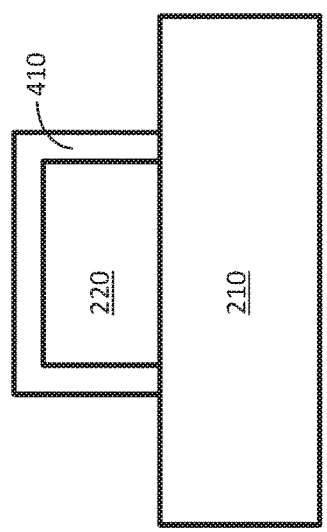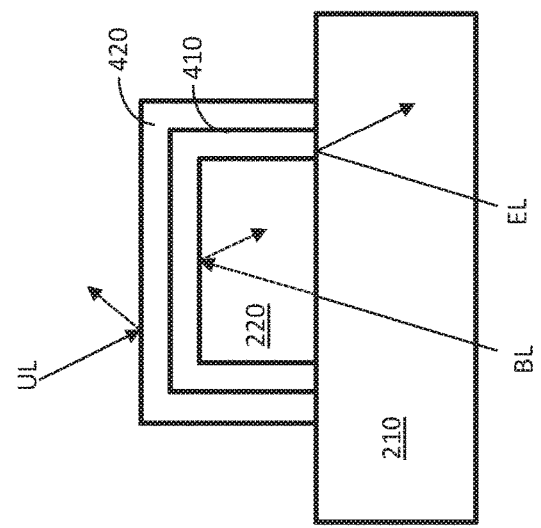

METHOD OF MANUFACTURING A TOUCH SENSOR WITH A LOW VISIBILITY CONDUCTIVE MICRO-MESH

RELATED APPLICATIONS

This application claims priority benefit from U.S. Provisional Application No. 62/933,576, filed on Nov. 11, 2019, the disclosure of which is incorporated herein in its entirety by reference.

TECHNICAL FIELD

Embodiments of the present disclosure relate generally to touch screen enabled systems. More particularly, embodiments of the disclosure relate to touch sensors with metallic micro-mesh.

BACKGROUND

A touch screen enabled system allows a user to control various aspects of the system by touch or stylus on the screen. A user may interact directly with one or more objects depicted on a display device by touch or stylus that are sensed by a touch sensor. The touch sensor typically includes a conductive pattern disposed on a substrate configured to sense touch. Touch screens are commonly used in consumer, commercial, and industrial systems.

The conductive pattern of touch screens has been traditionally made from transparent conductive material such as indium tin oxide (ITO). However, with the advent of multi-touch screen systems and large displays, it is advantageous to have highly conductive micro mesh systems, for example, conductive micro mesh systems using copper fine lines. Copper is a much better conductor than ITO. However, there are a number of challenges with highly conductive micro mesh systems including conductive mesh touch sensors. For example, a big challenge with conductive mesh touch sensors is visibility to eyes of end users. At certain angles, in particular under bright lights or outdoors, conductive lines of the conductive mesh touch sensors may be highly reflective and distracting to the end users.

Specifically, there are two sources of reflections that may be caused by the conductive lines of the touch sensor. First, light hitting the top of the upper conductive mesh is reflected back towards the user, making the lines visible. Second, light hitting the bottom of the lower conductive mesh may also be reflected towards the user, making the conductive lines of the lower conductive mesh visible. Both reflections need to be reduced or, preferably eliminated.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Disclosed herein is a method for manufacturing a touch sensor with a low visibility conductive micro-mesh. The method provides solutions to the off-angle viewer reflectivity problem by encasing the conductive lines on both sides of the substrate in low reflectivity material. The lines have a coating of low reflectivity material to reduce or prevent reflection of light hitting the top of the lines. The lines also have blocking material below the underside of the lines, to reduce or block reflections of light from the bottom of the lines.

In disclosed aspects, catalytic nanoparticles (e.g., carbon coated nanoparticles) may be dispersed into a photoresist to have a photoresist composition. The photoresist composition may be subsequently applied to an optically transparent substrate. The carbon coated nanoparticle photoresist composition may be subsequently photo exposed, developed, and etched. Then, a highly conductive material, e.g., copper, may be plated. Next, a metal passivation layer or protective coating, e.g., dark palladium, may be applied. In this way, a touch sensor may have a micro-mesh pattern that has a low optical reflectivity and visibility.

In an aspect of the disclosure, a method of manufacturing a touch sensor with a conductive micro-mesh is provided. The method comprises dispersing catalytic nanoparticles into a photoresist to have a catalytic photoresist composition. The method further comprises applying the catalytic photoresist composition including the photoresist and the catalytic nanoparticles onto a transparent substrate of the touch sensor. The method comprises photo patterning the catalytic photoresist composition to have a layer of catalytic photoresist patterns. The method comprises plating a metal layer on the layer of catalytic photoresist patterns. The method further comprises applying a metal passivation layer over the metal layer.

In an aspect of the disclosure, a touch sensor with a conductive micro-mesh is disclosed. The touch sensor comprises a transparent substrate, and a layer of catalytic photoresist patterns of a catalytic photoresist composition, the catalytic photoresist composition including a photoresist and catalytic nanoparticles. The touch sensor further comprises a metal conductive layer with conductive patterns on the layer of catalytic photoresist patterns. The touch sensor further comprises a metal passivation layer over the metal layer.

In further aspects of the disclosure, a touch screen is provided having touch sensor with a low-visibility conductive micro-mesh. The touch screen comprises a display layer, e.g., an LCD, an OLED, etc., a touch sensor adhered to the display layer with an optically clear adhesive, and a cover glass over the touch screen. The touch sensor comprises a transparent substrate, and a layer of catalytic photoresist patterns of a catalytic photoresist composition, the catalytic photoresist composition including a photoresist and catalytic nanoparticles. The touch sensor further comprises a metal conductive layer with conductive patterns on the layer of catalytic photoresist patterns. The touch sensor further comprises a metal passivation layer over the metal layer.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

Embodiments of the disclosure are illustrated by way of example and not limitation in the figures of the accompanying drawings in which like references indicate similar elements.

FIG. 1 is a block diagram illustrating a cross section of a touch screen according to some embodiments.

FIGS. 2A and 2B are block diagrams illustrating an example of a cross-section view of a touch sensor according to some embodiments.

FIGS. 3A and 3B are block diagrams illustrating an example of a cross-section view of a touch sensor according to some embodiments.

FIGS. 4A and 4B are block diagrams illustrating an example of a cross-section view of a touch sensor according to some embodiments.

FIGS. 5A-5C are block diagrams illustrating an example of a cross sectional view of a touch sensor after photolithography processing and electroless plating according to some embodiments.

DETAILED DESCRIPTION

Figure 6:
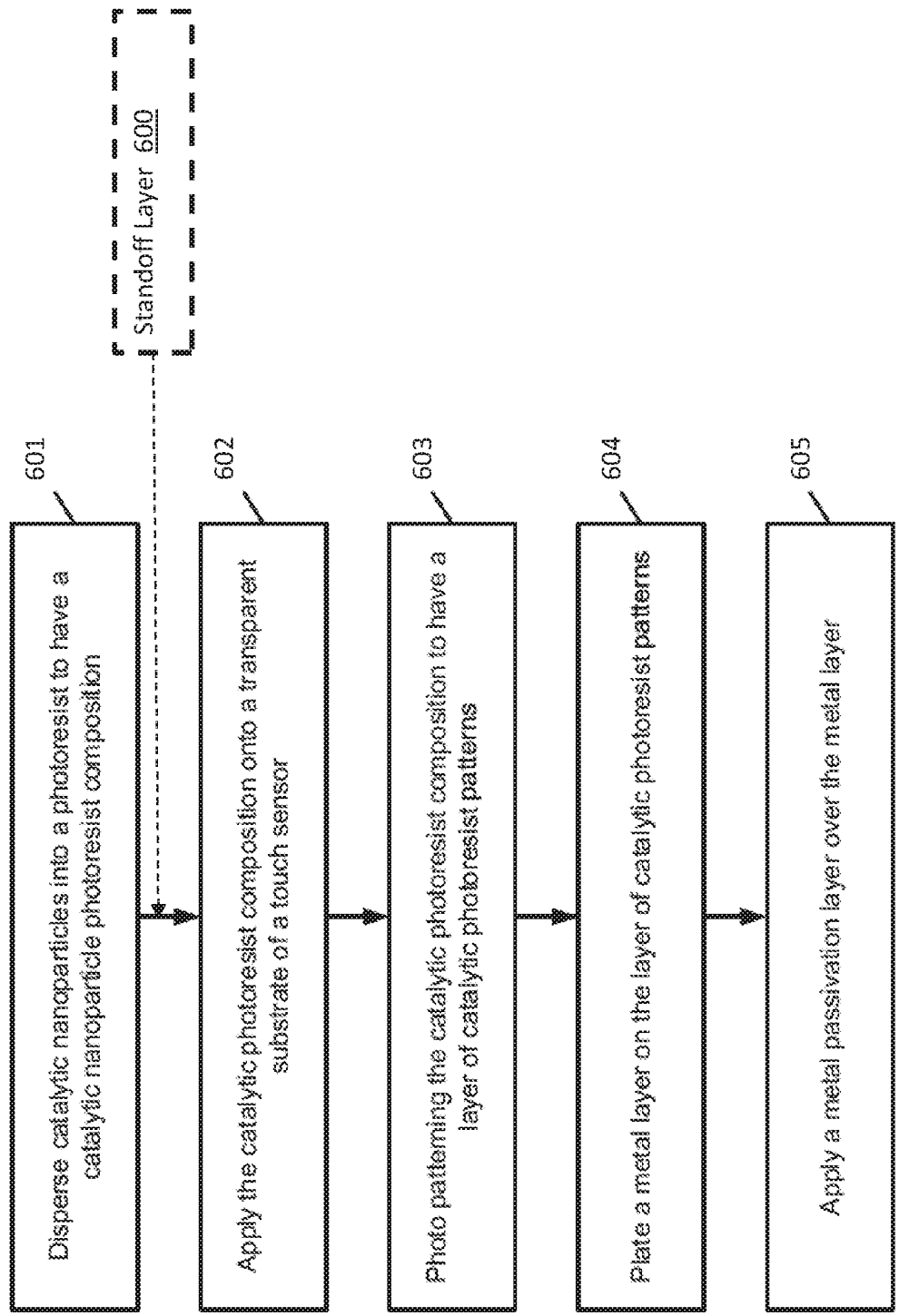
FIG. 6 is a block diagram illustrating a method of manufacturing a conductive mesh touch sensor according to some embodiments.

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Embodiments of the inventive metallic mesh touch sensor will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

FIG. 1 shows a cross-section of a touch screen 100 which may implement a touch sensor in accordance with embodiments of the present disclosure. Touch screen 100 includes a display device 110 (e.g., LCD, OLED, etc.) and a touch sensor 130 that overlays at least a portion of a viewable area of display device 110. In certain embodiments, an optically clear adhesive ("OCA") or resin 140 may bond a bottom side of touch sensor 130 to a top, or user-facing, side of display device 110. In other embodiments, an isolation layer or air gap 140 may separate the bottom side of touch sensor 130 from the top, or user-facing, side of display device 110. A transparent cover lens 150 may overlay a top, or user-facing, side of touch sensor 130. The transparent cover lens 150 may be composed of polyester, glass, or any other material suitable for use as a cover lens 150. In certain embodiments, an OCA or resin 140 may bond a bottom side of the transparent cover lens 150 to the top, or user-facing, side of touch sensor 130. A top side of transparent cover lens 150 faces the user and protects the underlying components of touch screen 100. Incidentally, in this disclosure the term top or upper refers to the side facing the user when the touch screen is in use, while bottom or lower indicate the direction away from the user.

The components and/or the stack of touch screen 100 may vary based on an application or design in accordance with some embodiments of the present disclosure. The touch sensor 130, or the function that the touch sensor implements, may be integrated into the display device 110 stack (not independently illustrated) in accordance with some embodiments of the present disclosure.

The callout in FIG. 1 illustrates a cross section of a small section of the touch sensor. Generally, the touch sensor comprises a transparent substrate 102, a top conductive mesh 104 and a bottom conductive mesh 106. When superimposed, the top mesh 104 and the bottom mesh 106 form a plurality of intersections. The position of the touch or stylus on the sensor is sensed at each of the intersections.

Historically, touch screens have been made from transparent conductive material such as indium tin oxide. However, with the advent of multi-touch systems and displays being larger and larger, it is desirable to have highly conductive micro mesh systems, for example, conductive micro mesh systems made from copper fine lines. One big challenge to date with conductive mesh touch sensors is visibility to eyes of observers or end users. At certain angles, in particular under bright lights or outdoors, conductive meshes of metallic mesh touch sensors may be highly reflective and distracting to the end users. This is exemplified in the callout of FIG. 1, where incident light L may be reflected R1 from the top of the upper lines of the mesh 104, and also light may reflect R2 from the bottom of the lower lines of mesh 106.

Disclosed herein is a method for manufacturing a touch sensor with a low visibility conductive micro-mesh having metallic lines. The method provides solutions to the off-angle viewer reflectivity problem by encasing each of the conductive lines of the wire mesh using an opaque coating over the line and an opaque underlayer below the line. The opaque underlayer is formed by using catalytic nanoparticle (e.g., carbon coated nanoparticles) photoresist composition, photo patterning the photoresist composition, and subsequent plating with a highly conductive material, e.g., copper. The opaque coating is formed by applying a metal passivation layer or protective coating, e.g., dark palladium, over the conductive lines.

In one embodiment, catalytic nanoparticles (e.g., carbon coated nanoparticles) may be dispersed into a photoresist to have a photoresist composition. The photoresist composition may be subsequently applied to an optically transparent substrate. The carbon coated nanoparticle photoresist composition may be subsequently photo exposed, developed, and etched. Then, a highly conductive material, e.g., copper, may be plated over the patterned photoresist. Next, a metal passivation layer or protective coating, e.g., dark palladium, may be applied over the copper. In this way, the process may result in a touch sensor with a fine line micro-mesh grid pattern that has a low optical reflectivity and visibility, when viewed by an observer or end user. By use of the opaque underlayer and opaque coating, reflection from either side of the micro-mesh is avoided.

FIG. 2A is a block diagram illustrating an example of a cross-section view of the first step in producing a touch sensor, e.g., sensor 130, according to some embodiments (only a small section of the sensor is shown). The touch sensor may have an optically transparent substrate 210. In one embodiment, the transparent substrate may be a flexible polymer film. A photoresist composition 220 may be formed by dispersing catalytic nanoparticles, e.g., carbon coated nanoparticles, into a photoresist. The photoresist composition 220 may be subsequently applied to the optically transparent substrate 210. The photoresist composition 220 may be subsequently photo exposed, developed, and etched, to form the grid design, as illustrated in FIG. 2B.

With respect to the transparent substrate 210, "transparent" may refer to being capable of transmitting a substantial portion of visible light through the substrate which is suitable for a given touch sensor application or design. In some touch sensor applications, "transparent" may refer to transmittance of at least 85% of incident visible light through the substrate. However, other transmittance values may be desirable for other touch sensor applications or designs. In certain embodiments, transparent substrate 210 may be polyethylene terephthalate ("PET"), polyethylene naphthalate ("PEN"), cellulose acetate ("TAC"), cycloaliphatic hydrocarbons ("COP"), polymethylmethacrylates ("PMMA"), polyimide ("PI"), bi-axially-oriented polypropylene ("BOPP"), polyester, polycarbonate, glass, copolymers, blends, or combinations thereof. In other embodiments, transparent substrate 210 may be any other transparent material suitable for use as a touch sensor substrate such as eagle glass, flexible glass, and quartz. The composition of transparent substrate 210 may vary based on an application or design.

The catalytic photoresist composition 220 may include a positive or negative photoresist component and a catalyst component that may include catalytic nanoparticles. In some embodiments, the negative photoresist may be advantageous. In some embodiments, the negative photoresist may be acrylic phenolic polymer. In other embodiments, the negative photoresist may be acrylic, epoxy, urethane, or combinations of one or more of the aforementioned compositions. The negative photoresist may vary in accordance with some embodiments of the present disclosure.

In some embodiments, the catalytic nanoparticles may be silver nanoparticles coated with carbon. In other embodiments, the catalytic nanoparticles may be copper oxide carbon coated nanoparticles. Metal (e.g., copper) reflection may be reduced by the carbon absorbing the light. In still other embodiments, the catalytic nanoparticles may be dark palladium. The type of catalytic nanoparticles may vary based on an application or a design.

The catalytic nanoparticles are embedded in the photoresist in order to form nucleation sites for the electroless deposition of copper. By having catalyst nanoparticles in the photoresist composition, and then patterning the photoresist, the catalyst nanoparticles will form nucleation sites only over the developed photoresist, so as to form the mesh design. Unexpectedly, it was discovered by the subject inventor that coating the catalyst particles with carbon does not degrade the function of the nanoparticles to form nucleation sites. Various experimentations performed by the inventor demonstrated that, surprisingly, the electroless plating process was not affected by the coating of the catalyst particles. Also, further experimentations demonstrated that opaque palladium nanoparticles may also function as a catalyst to form nucleation sites for the electroless plating.

In certain embodiments, the catalytic photoresist composition 220 may include negative photoresist component content in a range between approximately 30 percent and approximately 95 percent by weight and catalyst component content in a range between approximately 5 percent and approximately 70 percent by weight. In other embodiments, the catalytic photoresist composition 220 may include negative photoresist component content in a range between approximately 50 percent and approximately 70 percent by weight and catalyst component content in a range between approximately 30 percent and approximately 50 percent by weight.

In some embodiments, the size of the catalytic nanoparticles may range from 5 to 250 nanometers, for example, the catalytic nanoparticles may have a size of 15-25 nanometers. The nanoparticles have a metallic core and a carbon coating. For example, the photoresist may be an epoxy-based negative resist SU8.

The catalytic nanoparticle composition 220 may be applied to the substrate 210 by a number of techniques such as gravure, reverse gravure, slot die, spray, flexographic, or Meyer rod techniques. The catalytic nanoparticle composition 220 after drying and baking may range in thickness from 1 to 100 microns. For example, the catalytic nanoparticle composition 220 may have a thickness of 5 to 25 microns. After application to the substrate 210, the multilayer stack may be exposed to UV radiation.

The UV radiation from an external source may be applied to the transparent substrate 210 to form the mesh pattern design. The UV radiation incident on a photomask (not shown) may pass through a negative image of a first conductive pattern onto the catalytic photoresist composition 220 disposed on a first side of the transparent substrate 210. This transfers the pattern design from the mask to the photoresist.

After the UV radiation from the external source is applied to the transparent substrate 210, a developer may be applied to the catalytic photoresists composition 220. In some embodiments, the developer may include a water-based alkaline solution. In other embodiments, the developer may include an organic solvent such as, for example, Carbitol™, or Dowanol™. The composition of the developer may vary with the catalytic photoresist composition in accordance with some embodiments of the present disclosure.

The developer may loosen or remove an unexposed portions of the catalytic photoresists composition 220, leaving a catalytic photoresist image of the first conductive pattern on the first side of the transparent substrate 210 and a catalytic photoresist image of the second conductive pattern on the second side of the transparent substrate 210. In certain embodiments, an optional hard bake may be performed on the transparent substrate 210 after development. Hard-bake typically includes heating the transparent substrate 210 to a sufficient temperature for a sufficient amount of time to stabilize and harden the developed catalytic photoresist composition 220 prior to stripping. The temperature and the amount of time required to hard-bake may vary based on the composition and the applied thickness of the catalytic photoresist composition 220. After development, any remaining catalytic photoresist composition 220 not exposed to UV radiation is stripped, leaving catalytic photoresist patterns 430 in the image of the first conductive pattern on the first side of the transparent substrate 210.

FIG. 3A is a block diagram illustrating an example of a cross-section view of a touch sensor 300 with catalytic nanoparticle photoresist composition 220 deposited on both sides of the substrate 210, according to some embodiments. The photoresist composition 220 may be applied to both sides of the optically transparent substrate 210, to form the upper mesh and lower mesh. The photoresist composition 220 on both sides may be subsequently photo exposed, developed, and etched, as illustrated in FIG. 3B. As exemplified in FIG. 3B, the design of the upper mesh and lower mesh need not be the same.

The UV radiation from an external source may be applied to both sides of the transparent substrate 210 at the same time, e.g., by splitting the beam of a UV source into two paths. The UV radiation in one path incident on a photomask (not shown) and pass through a negative image of a first conductive pattern onto the catalytic photoresist composition 220 disposed on a first side, e.g., the upper side, of the transparent substrate 210. The UV radiation in the other path incident on a second photomask may pass through a negative image of a second conductive pattern onto the catalytic photoresist composition 220 disposed on a second side, e.g., lower side, of the transparent substrate 210. The UV exposed portions of the catalytic photoresists are polymerized by the UV radiation.

FIG. 4A is a block diagram illustrating an example of a cross sectional view of a touch sensor after photolithography processing and electroless plating, according to some embodiments. FIG. 4A illustrates only a very small section of the sensor, in order to focus on the process of forming a metal conductive line. As illustrated in FIG. 4A, a layer of metal 410 may be plated on the remaining catalytic photoresist composition 220, thereby forming the conductive patterns on the transparent substrate 210. In some embodiments, an electroless plating process may be used to electroless plate a first metal 410 on the catalytic photoresist composition patterns 220 disposed on the substrate 210. In other embodiments, an immersion bath process may be used to immersion plate a first metal 410 on the catalytic photoresist composition 220. Other methods of disposing metal on the catalytic photoresist composition pattern 220 may be used as well, but in the embodiments of FIG. 4A the benefit of having catalyst embedded in the photoresist are taken advantage of. The conductive line 410 forms part of a conductive metal mesh for the sensor. When a width of the conductive line 410 is small, e.g., in microns, the conductive patterns result in a conductive micro-mesh for the sensor, which is too thin to be visible to the user.

In some embodiments, the first metal 410 may be copper. In other embodiments, the first metal may be copper alloy. Other metals or metal alloys may be used as well, especially metals that interact with the catalyst nanoparticles. In certain embodiments, more than one metal layers may be disposed on the patterned catalytic photoresist composition 220.

In certain embodiments, an opaque metal passivation layer 420, for example, palladium, or other opaque protective coating, may be applied, e.g., by electroless plating, over the metal 410 to protect the metal 410 from corrosion and other environmental failure. Additionally, the metal passivation layer 420 may impart a dull gray black color that reduces or minimizes reflections from the metal, e.g., copper, plated micro-mesh features. As exemplified by the arrow UL, the opaque passivation layer 420 may reduce or minimize any direct or off angle light reflectivity from the top of metal layer 410, thus further enabling manufacturing of a touch sensor with a low visibility micro-mesh, when applied to an electronic display device.

However, when the metal line shown in FIG. 4B is the lower metal mesh, i.e., the drawing is flipped 180°, light hitting the sensor may reflect from the metal 410 (refer to FIG. 3B having mesh on the bottom of the substrate). This is because the substrate is transparent and standard photoresist is also transparent. Conversely, as exemplified in FIG. 4B by arrow BL, the catalytic nanoparticle (e.g., carbon coated silver nanoparticle) embedded in the photoresist form a black non-reflective surface that attenuates the light as it passes towards the metal line, and further prevents any reflected light from the metal line. Thus, the combination of catalytic nanoparticles (e.g., carbon coated silver nanoparticles) and dark palladium passivation solves the problem of metallic micro-mesh bright light reflectivity and enables an invisible touch sensor. Specifically, the dark palladium passivation encases the conductive lines of the wire mesh and prevents the mesh from reflecting light towards the viewer. The photoresist composition encases the conductive lines of the wire mesh from the underside, thus preventing reflection from the back of the lines.

As noted, the metal lines are rather thin, in the range of 200-400 nanometer. Consequently, as illustrated in FIG. 4B by arrow EL, there is a possibility that some light will be reflected from the edges of the metal line. The potential for such a reflection is solved by the embodiment illustrated in FIGS. 5A-5C.

FIG. 5A is a block diagram illustrating an example of a cross-section view of a touch sensor with a photoresist standoff layer 510, according to some embodiments. The photoresist standoff layer 510 may be deposited on the substrate 210 and is made of a photoresist having no catalyst therein. The catalytic photoresist composition layer 220 may be deposited on top of the photoresist standoff layer 510. The catalytic photoresist composition layer 220 may comprise catalytic nanoparticles, e.g., carbon coated silver nanoparticles. The photoresist standoff layer 510 may be either a positive or negative resist, but include no catalyst. The thickness of the standoff layer 510 can vary from 0.1 to 25 microns. For example, the thickness of the standoff layer 510 may be between 0.5 to 10 microns. The photoresist standoff layer may be applied and processed together with the photoresist composition layer 220, as discussed above. The illustration of FIG. 5A shows the photoresist standoff layer 510 and the photoresist composition layer 220 after photolithography processing and patterning, according to some embodiments.

FIG. 5B is a block diagram illustrating an example of a cross sectional view of a touch sensor with a photoresist standoff layer 510 after photolithography processing and electroless plating of the metal mesh, according to some embodiments. The photoresist standoff layer 510 may be used to assist with reducing reflections from the edge of metal plated conductive layer 410. The two layers including the photoresist standoff layer 510 and the catalytic photoresist composition layer 220 may be patterned as shown in FIG. 5A. Next, the metal layer 410, e.g., a layer of copper or copper alloy, may be electroless plated. However, since the standoff layer 410 has no catalyst therein, the metal is plated only on the patterned catalytic photoresist layer 220, and not on the standoff layer 510. Consequently, the metal layer 410 does not extend to the substrate, thus forming a gap 505 between the edge of metal line 410 and the substrate 210.

FIG. 5C illustrates the situation after a metal passivation layer 420, e.g., a layer of dark palladium, has been applied over the copper layer 410. As shown, since the passivation 420 is formed over the metal line 410, the passivation is applied also over the exposed edge of copper line, and may even fill the gap 505. In this manner, the photoresist standoff layer 510 enables adding the metal passivation (e.g., dark palladium) conformal coating 420 over the metal (e.g., copper) plated conductive layer 410, including covering the edge of the line formed by conductive layer 410. Otherwise, an edge of the copper layer may be visible in a reflection, as exemplified by arrow EL, which is now attenuated due to the passivation extending into the gap 505.

As noted previously, it was unexpectedly discovered that palladium nanoparticles may be used as the catalyst when mixed with the photoresist. Accordingly, while in some embodiments coated nanoparticles, e.g., carbon coated silver nanoparticles, are used as the catalyst, in other embodiments palladium nanoparticles are used as the catalyst. The palladium particles are naturally dark and therefore require no coating. Thus, any of the embodiments disclosed herein may use dark palladium nanoparticles as catalyst instead of carbon coated silver, thereby providing palladium nanoparticle photoresist composition.

The touch sensors as shown in FIGS. 4A-5C may be used in accordance with one or more embodiments of the present disclosure. As shown with respect to FIG. 3B, the sensor is generally double-sided, including conductor lines disposed on opposing sides of the same transparent substrate 210. For simplicity of explanation only one side is shown in FIGS. 4A-5C, but it should be appreciated that the structure of the conductive lines shown in these Figures is simply duplicated to the opposite side of the substrate. Other touch sensor stacks, including those that vary in the number, type, organization, and/or configuration of substrate(s) and/or conductive pattern(s) are within the scope of one or more embodiments of the present disclosure. One or more of the above-noted touch sensors may be used in applications where a touch sensor is integrated into display device in accordance with one or more embodiments of the present disclosure.

FIG. 6 is a flow diagram illustrating an example of a method of manufacturing a conductive mesh touch sensor according to some embodiments. The method provides solutions to the off-angle viewer reflectivity problem by using a catalytic nanoparticle (e.g., carbon coated nanoparticles or non-coated palladium nanoparticle) photoresist composition, photo patterning the photoresist composition, and subsequent electroless plating with a highly conductive material, e.g., copper, and applying a metal passivation layer or protective coating, e.g., dark palladium. In this way, a touch sensor may have a fine line micro-mesh pattern that has a low optical reflectivity and visibility, when viewed by an observer or end user from either side of the micro-mesh patterned optically transparent substrate.

At 601, catalytic nanoparticles may be dispersed into a photoresist to have a catalytic photoresist composition. The composition and type of photoresist, as well as composition and size of the nanoparticles, have been described elsewhere herein. At 602, the catalytic photoresist composition including the photoresist and the catalytic nanoparticles may be applied onto a transparent substrate of the touch sensor. As shown by the dashed lines, a standoff layer may optionally be applied at 600, as described with respect to FIGS. 5A-5C. In such a case, the catalytic photoresist composition is applied over the optional standoff layer.

At 603, the catalytic photoresist composition may be photo patterned to have a layer of catalytic photoresist patterns. If the standoff layer 600 has been applied, the catalytic photoresist composition can be photo patterned and developed together with the standoff layer. At 604, a metal layer may be plated on the layer of catalytic photoresist patterns. At 605, a metal passivation layer may be applied over the metal layer.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While the present disclosure has been disclosed in example embodiments, those of ordinary skill in the art will recognize and appreciate that many additions, deletions and modifications to the disclosed embodiments and their variations may be implemented without departing from the scope of the disclosure. A wide range of variations to those implementations and embodiments described herein are possible. Components and/or features may be added, removed, rearranged, or combinations thereof. Similarly, method steps may be added, removed, and/or reordered.

Likewise various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Accordingly, reference herein to a singular item includes the possibility that a plurality of the same item may be present. More specifically, as used herein and in the appended claims, the singular forms "a," "an," "said," and "the" include plural referents unless specifically stated otherwise. In other words, use of the articles allow for "at least one" of the subject item in the description above as well as the claims below.

Additionally as used herein, a phrase referring to "at least one of" a list of items refers to any combination of those items, including single members. As an example, "at least one of: a, b, or c" is intended to cover: a, b, c, a-b, a-c, b-c, and a-b-c.

Certain features that are described in this specification in the context of separate embodiments also can be implemented in combination in a single embodiment. Conversely, various features that are described in the context of a single embodiment also can be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations may be described as occurring in a particular order, this should not be understood as requiring that such operations be performed in the particular order described or in sequential order, or that all described operations be performed, to achieve desirable results. Further, other operations that are not disclosed can be incorporated in the processes that are described herein. For example, one or more additional operations can be performed before, after, simultaneously, or between any of the disclosed operations. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single product or packaged into multiple products. Additionally, other embodiments are within the scope of the following claims. In some cases, the actions recited in the claims can be performed in a different order and still achieve desirable results.

Terminology used herein is for the purpose of describing particular embodiments only and is not intended to be limiting of the invention. For example, as used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items and may be abbreviated as "/".

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

Although the terms "first" and "second" may be used herein to describe various features/elements (including steps), these features/elements should not be limited by these terms, unless the context indicates otherwise. These terms may be used to distinguish one feature/element from another feature/element. Thus, a first feature/element discussed below could be termed a second feature/element, and similarly, a second feature/element discussed below could be termed a first feature/element without departing from the teachings of the present invention.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is ±0.1% of the stated value (or range of values), ±1% of the stated value (or range of values), ±2% of the stated value (or range of values), ±5% of the stated value (or range of values), ±10% of the stated value (or range of values), etc. Any numerical range recited herein is intended to include all sub-ranges subsumed therein.

Although various illustrative embodiments are described above, any of a number of changes may be made to various embodiments without departing from the scope of the invention as described by the claims. For example, the order in which various described method steps are performed may often be changed in alternative embodiments, and in other alternative embodiments one or more method steps may be skipped altogether. Optional features of various device and system embodiments may be included in some embodiments and not in others. Therefore, the foregoing description is provided primarily for exemplary purposes and should not be interpreted to limit the scope of the invention as it is set forth in the claims.

The examples and illustrations included herein show, by way of illustration and not of limitation, specific embodiments in which the subject matter may be practiced. As mentioned, other embodiments may be utilized and derived therefrom, such that structural and logical substitutions and changes may be made without departing from the scope of this disclosure. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A method of manufacturing a touch sensor with a conductive micro-mesh comprising:
   dispersing carbon-coated metallic nanoparticles into a photoresist to form a catalytic photoresist composition;
   applying a standoff layer over a transparent substrate of the touch sensor;
   applying the catalytic photoresist composition over the standoff layer;
   photo patterning the standoff layer and the catalytic photoresist composition to have a layer of catalytic photoresist pattern over a standoff layer pattern;
   plating a metal layer on the layer of catalytic photoresist pattern; and
   applying a metal passivation layer over the metal layer.

2. The method of claim 1, wherein dispersing the carbon-coated metallic nanoparticles to form a catalyst component content comprises dispersing the nanoparticles in a range between 5 percent and 70 percent by weight into a photoresist composition forming photoresist component content in a range between 30 percent and 95 percent by weight.

3. The method of claim 2, wherein the catalytic photoresist composition includes negative photoresist component content in a range between 50 percent and 70 percent by weight and catalyst component content in a range between 30 percent and 50 percent by weight.

4. The method of claim 1, wherein the carbon-coated metallic nanoparticles have a size between 15 to 30 nanometers.

5. The method of claim 1, wherein plating the metal layer comprises forming a gap between the metal layer and the substrate, thus exposing the standoff layer between the catalytic photoresist composition and the transparent substrate.

6. The method of claim 1, further comprising applying the catalytic photoresist composition to both sides of the substrate.

7. The method of claim 1, wherein the catalytic nanoparticles include carbon coated silver nanoparticles.

8. The method of claim 1, wherein the catalytic nanoparticles include carbon coated copper oxide nanoparticles.

9. The method of claim 1, wherein the metal layer includes copper.

10. The method of claim 1, wherein the metal passivation layer includes palladium.

11. A method for fabricating a touch sensor, comprising:
dispersing carbon-coated metallic nanoparticles into a photoresist to form a catalytic photoresist;
applying a standoff layer over an optically transparent substrate, the standoff layer formed of non-catalytic photoresist;
applying the catalytic photoresist over the standoff layer;
photo patterning the standoff layer and the catalytic photoresist to form a layer of catalytic photoresist patterns over standoff patterns on the optically transparent substrate; and,
plating a metal layer on the layer of catalytic photoresist patterns.

12. The method of claim 11, further comprising applying a metal passivation layer over the metal layer.

13. The method of claim 12, further comprising applying the optically transparent substrate to a display device.

14. The method of claim 12, further comprising adhering the optically transparent substrate to a display device using optically clear adhesive.

15. The method of claim 12, wherein the metal passivation layer includes palladium.

16. The method of claim 11, further comprising applying a metal passivation layer over the metal layer and into a gap formed between the catalytic photoresist composition and the transparent substrate.

17. The method of claim 11, wherein dispersing carbon-coated metallic nanoparticles comprises dispersing one of carbon-coated silver nanoparticles or carbon-coated copper nanoparticles to form a catalyst component content in a range between 5 percent and 70 percent by weight into a photoresist composition forming photoresist component content in a range between 30 percent and 95 percent by weight.

18. The method of claim 17, wherein the catalytic photoresist composition includes negative photoresist component content in a range between 50 percent and 70 percent by weight and catalyst component content in a range between 30 percent and 50 percent by weight.

19. The method of claim 11, wherein the carbon-coated metallic nanoparticles have a size between 15 to 30 nanometers.

20. The method of claim 11, wherein the carbon-coated metallic nanoparticles include carbon coated silver nanoparticles.

21. The method of claim 11, wherein the carbon-coated metallic nanoparticles include carbon coated copper oxide nanoparticles.

22. The method of claim 11, wherein the metal layer includes copper.

* * * * *